United States Patent [19]
Park et al.

[11] Patent Number: 5,677,089
[45] Date of Patent: Oct. 14, 1997

[54] PHOTOMASK FOR FORMING T-GATE ELECTRODE OF THE SEMICONDUCTOR DEVICE

[75] Inventors: Byung-Sun Park, Yusong-ku; Yong-Ho Oh, Joong-ku; Sang-Soo Choi; Hyung-Joun Yoo, both of Yusong-ku, all of Rep. of Korea

[73] Assignee: Electronics and Telecommunications Research Institute, Daejeon, Rep. of Korea

[21] Appl. No.: 548,302

[22] Filed: Nov. 1, 1995

Related U.S. Application Data

[63] Continuation-in-part of Ser. No. 357,017, Dec. 16, 1994, Pat. No. 5,543,253.

[51] Int. Cl.$^6$ ........................................ G03F 9/00
[52] U.S. Cl. ........................ 430/5; 430/311; 430/312; 430/313
[58] Field of Search ......................... 430/5, 311, 312, 430/313, 394; 437/29; 156/657, 659.1

[56] References Cited

U.S. PATENT DOCUMENTS 5,480,746  1/1996  Jinbo et al. ........................ 430/311

*Primary Examiner*—S. Rosasco
*Attorney, Agent, or Firm*—Larson and Taylor

[57] ABSTRACT

A photomask according to the present invention for forming a T-gate electrode for Metal Semiconductor Field Effect Transistor and High Electron Mobility Transistor by performing each of the exposing process and the developing process once is disclosed. The photomask is composed of a primary mask positioned at the top surface of the transparent substrate made of Silica glass and a secondary mask positioned at the top surface of the transparent substrate for enhancing the resolution of the primary mask. The primary mask includes an opaque layer in which a material for mask pattern of, for example, Cr or $Fe_2O_3$, or other opaque materials is deposited at the bottom surface of the transparent substrate, thereby preventing the light radiated from being transmitted, and a first and second patterns for forming the leg portion and the head portion of the T-gate electrode by simultaneously radiating the light into the exposed portion of the transparent substrate. The secondary mask includes a phase shifting part for shifting the phase of the light so radiated to effect the diffraction and interference phenomenon of the light transmitted through the predetermined portion of the top surface of the transparent substrate, which is etched to a predetermined extent, and an optical transmissive part for transmitting the light as it is, without shifting the phase of the light. According to the present invention, a simplified photoresist pattern for forming a T-gate electrode of the semiconductor device can be obtained by applying the exposing process and the developing process once onto a single layer of the resist, using the photolithography. The superior resolution ability can also be achieved by controlling the diffraction and interference phenomenon of the light transmitted through the phase shifting part and the transmissive part of the secondary.

23 Claims, 4 Drawing Sheets

PHOTOMASK FOR FORMING T-GATE ELECTRODE OF THE SEMICONDUCTOR DEVICE

This is a continuation in part of Ser. No. 08/357,017 filed Dec. 16, 1994 now U.S. Pat. No. 5,543,253.

FIELD OF THE INVENTION

The present invention relates to a photomask for forming a T-shaped gate electrode (hereinafter, referred to as "the T-gate electrode"), and more particularly to a photomask for forming a T-gate electrode for Metal Semiconductor Field Effect Transistor (hereinafter, referred to as "MESFET") and High Electron Mobility Transistor (hereinafter, referred to as "HEMT") by performing each of the exposing process and the developing process once.

BACKGROUND OF THE INVENTION

Recently, in MESFET high speed devices, such as MESFET's and HEMT's which are mainly used in a satellite broadcasting receiver, the high speed logic circuit, a power module, an MMOC, etc., smaller gate width for high modulating operation as well as lower resistance for high conductivity of the semiconductor device are required. In addition, a wider pattern area for low noise is also needed. To satisfy the above requirements in the prior art, a T-gate electrode has been generally used as the gate electrode of the devices in which the bottom portion (hereinafter, referred to as "the leg portion") of the gate electrode contacting with the semiconductor layer is narrow and the top portion (hereinafter, referred to as "the head portion") thereof is wide, thereby resulting in a cross-section thereof taken in the longitudinal direction to be in the form of a capital letter "T". When the T-gate electrode as described above is formed utilizing a commercially available photolithography, the resolution ability of the photolithography can not reach the fine line-width of the pattern for gate electrode below 0.5 micrometer, as desired. Thus, an electron beam lithography has been presently used for the above purpose.

The method of using the above mentioned electron beam lithography is that a resist pattern for T-gate electrode of the semiconductor device is formed by depositing two kinds of layers, having different sensitivities from each other with respect to a normal electron beam, on a predetermined portion of a semiconductor layer at which the T-gate electrode is formed, exposing them to the electron beam, and developing the exposed resist layers.

Explaining the method more in detail, the two resist layers, that is, a PMMA (polymethyle Methacrylate) resist having a low sensitivity to the electron beam is deposited as a lower layer and a co-polymer (MAA-MMA) resist having a high sensitivity thereto is then deposited as an upper layer. Therefore, if the above resist layer is exposed to the electron beam by radiating it and is then developed, the two resist layers each having different formations of different line-widths are formed depending upon the sensitivities thereof. That is to say, in the above two layered resist structures, the lower sensitive lower layer has a narrow line-width due to the narrow width to be exposed, whereas the higher sensitive upper layer has a wide line-width due to the wide width to be exposed. Thus, the sectional shape of the resulting resist pattern in the longitudinal direction has a capital letter "T"-shape. As a result, a T-gate electrode in which the surface of the leg portion of the gate electrode contacting with the semiconductor layer is narrow and the head portion thereof is large, can be obtained.

However, the method for forming the T-gate electrode of the semiconductor device by means of the electron beam lithography mentioned above has a disadvantage that the radiating time of the electron beam required for forming the resist pattern is so long that production yield decreases. Because the line-width of the resist pattern for the upper layer and the lower layer varies with the exposure time of the electron beam, it is difficult to successfully obtain a uniform resist pattern. Further, according to the above method, it has another problem that, since the resist patterns are made by two stacked layers, a metal deposited on the resist patterns is diffused into the boundary between the lower layer and the upper layer during the metal depositing process which is performed at a high temperature. In addition to the above problem presented in preparing the resist pattern itself, there also exists another problem in the manufacturing process of the semiconductor device. That is, in various processes other than the process of forming the T-gate electrode, an optical stopper is commonly used to perform photolithograpy in order to enhance the productivity in manufacturing. However, since the electron beam lithography equipment and the optical stopper have alignment techniques different from each other, the failure in registration at the mask superposition can not be avoided throughout the manufacturing process of the semiconductor device.

Therefore, attempts have recently been made to develop a method of forming the T-gate electrode of the semiconductor device utilizing photolithography. For further discussion of this method, see Hua-Yu Liu et al, "Fabrication of 0.1 T-shaped gates by phase-shifting optical lithography", SPIE, Vol No. 1927(1993), pp 42–52, which is incorporated herein by reference as if fully set forth hereinafter. This method utilizes two layered negative photoresist, which will now be described in detail. A negative photoresist for the lower layer is first deposited on the semiconductor substrate. An isolated space pattern is then formed by performing a patterning process of the negative photoresist of the lower layer to define a width of the leg portion of the gate electrode. A negative photoresist for the upper layer is deposited on the isolated space pattern, and then patterned to define a width of the head portion of the gate electrode, the width of which is larger than that of the leg portion thereof. Summarizing this method, the two layered photoresist for different masks is first deposited; the resist patterns, in which each pattern width of the leg portion and the head portion of the gate electrode is different from each other, is then formed; and a T-gate electrode of the semiconductor device is finally formed by depositing a metal on the entire surface of the resulting structure. According to the method discussed above, since an alternative mask of phase shift mask for enhancing resolution in the line-width of the resist pattern in addition to the stopper using an optical source of short wavelength, such as the KrF Exciter laser, is utilized therein, a fine line-width thereof below 0.25 micrometer can be obtained.

However, the manufacturing process of the method becomes complicated, because each of the exposing process and the development process thereof must be executed by using separate masks, the pattern widths of which are different from each other. Also, the resolution of the patterns is deteriorated by a swelling of the resist patterns, when an isolated space is formed. Furthermore, since the negative resists themselves are based on the cross-linking mechanism of the polymer, residuals form after the development process and thus an additional process for removing the residuals, such as $O_2$ Plasma descum is required, thereby undesirably enlarging the size of the gate line-width. In addition, the characteristics and reproducibility of the resulting device are also deteriorated due to interlayer residuals formed at the time of the hard baking process of the upper layer and the lower layer.

Therefore, other approaches have recently been made to develop a method of forming the T-gate electrode of the semiconductor device which has a simplified process of, for example, the exposing process and so on, and which prevent not only the swelling of the resist patterns during the developing process, but also the formation of residuals. It is well known to persons having an ordinary skill in the art that a positive photoresist is preferably used to enhance the resolution by suppressing the swelling of the resist patterns and to prevent residuals from being formed.

In the manufacturing process of the semiconductor device, the process can generally be simplified by reducing the number of the exposing steps and the developing steps. However, the prior art method has a drawback that the process is complicated, because each of the exposing process and the development process are required twice, respectively.

SUMMARY OF THE INVENTION

Therefore, it is an object of the present invention to overcome the above disadvantages in the prior art and to provide a photomask for forming a T-gate electrode of the semiconductor device, which is capable of forming the resist pattern by applying the exposing process and the developing process once onto a single layer of the resist, using photolithography.

It is a further object of the present invention to provide a photomask for forming a T-gate electrode of the semiconductor device, which is capable of enhancing the resolution of the resist pattern.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the below portion of the summary of the invention and the detailed description which describe the preferred embodiments in addition to the scope of the invention defined by the claims considered in conjunction with the accompanying drawings.

A photomask for forming a T-gate electrode of the semiconductor device according to the present invention is defined by the claims with specific embodiments shown in the attached drawings. For a purpose of summarizing the first embodiment of the invention, a photomask for forming a T-gate electrode of the semiconductor device having a wide head portion and a narrow leg portion comprises a transparent substrate having a top surface and a bottom surface, and a primary mask for forming a first pattern for said leg portion and a second pattern for said head portion formed by depositing an opaque layer at a predetermined portion of the bottom surface of said transparent substrate, so as not to permit light radiated onto the top surface to be transmitted, such that said first pattern is formed in a stripe shape in a longitudinal direction to expose a portion of the bottom surface of said transparent substrate at which said opaque layer is not deposited, and said second pattern is formed in a stripe shape at both sides of said first pattern in parallel to said first pattern. The second pattern is spaced apart from said opaque layer at a predetermined distance.

Thus, according to the first embodiment of the invention, a line-width of said first and second pattern can be controlled by increasing the intensity of the light being transmitted into said first pattern as compared to that into said second pattern, when exposing to a preselected light.

According to a second embodiment of the invention, it comprises a transparent substrate having a top surface and a bottom surface, and a primary mask for forming a first pattern for said leg portion and a second pattern for said head portion. The primary mask is formed by depositing an opaque layer at a predetermined portion of the bottom surface of said transparent substrate, so as not to permit light radiated onto the top surface to be transmitted, such that said first pattern is formed in a stripe shape in a longitudinal direction to expose a portion of the bottom surface of said transparent substrate at which said opaque layer is not deposited, and said second pattern is formed in a stripe shape at both sides of said first pattern in parallel direction with that of said first pattern. The second pattern is spaced apart from said opaque layer at a predetermined distance, so that a line-width of said first and second pattern is controlled by increasing the intensity of the light being transmitted into said first pattern as compared to that being transmitted into said second pattern, when exposed to a preselected light. It also includes a secondary mask formed on the top surface of said transparent substrate for enhancing the resolution ability of said primary mask. The secondary mask further includes a plurality of phase shifting parts formed by etching predetermined portions of the top surface of said transparent substrate to a predetermined depth for shifting the phase of light to be transmitted, so that the remaining portions of said transparent substrate not being etched define a plurality of optical transmissive parts for permitting the light to be transmitted without shifting the phase of light. The plurality of optical transmissive parts and phase shifting parts is sequentially and alternately arranged in a stripe shape in a parallel direction with those of said first and second patterns. As a result, since the light passing therethrough of said secondary mask has a phase difference therebetween, the resolution ability of said primary mask can be enhanced.

According to the second embodiment of the invention, the photomask comprises a transparent substrate having a top surface and a bottom surface, and a primary mask for forming a mask pattern formed in a stripe shape for passing the light without reducing the intensity of the light. The mask pattern is formed by depositing an opaque layer at predetermined portions of the bottom surface of said transparent substrate, so as not to permit light radiated onto the top surface to be transmitted, and a semitransparent layer formed between said predetermined portions, at which said opaque layer is deposited, for permitting the light to be passed by reducing the intensity of the light transmitted, such that said mask pattern is defined in a longitudinal direction at a portion at which said opaque layer and said semitransparent layer are not deposited, to expose a portion of the bottom surface of said transparent substrate. Therefore, a line-width of said first and second pattern can be controlled by increasing the intensity of the light being transmitted into said first pattern as compared to that into said second pattern, when exposed to a preselected light.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For a fuller understanding of the nature and objects of the invention, reference should be made to the following detailed description taken in conjunction with the accompanying drawings in which.

Similar reference character refer to similar parts throughout the several views of the drawings.

DETAILED DESCRIPTION OF THE PREFERRED EMBODIMENTS

Figure 1:
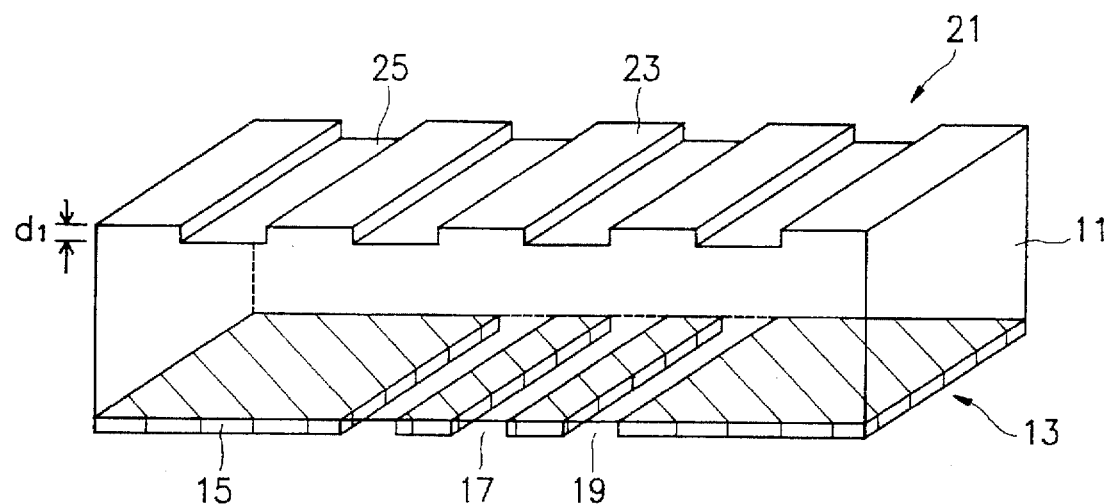
FIG. 1 is a perspective view of a photomask for forming a T-gate electrode of the semiconductor device according to a first embodiment of the present invention.

Referring to FIG. 1, a perspective view of a photomask for forming a T-gate electrode of a semiconductor device according to a first embodiment of the present invention is depicted.

The photomask is composed of a primary mask 13 positioned at the bottom surface of a transparent substrate 11 made of Silica glass and a secondary mask 21 positioned at the top surface thereof for enhancing the resolution of the primary mask 13.

The primary mask 13 includes an opaque layer 15 in which a material is deposited in a mask pattern, and can be for example, Cr or $Fe_2O_3$, or other opaque materials. Layer 15 is deposited, as thick as for example 500–1500 Angstrom, at the bottom surface of the transparent substrate 11. First and second patterns 17,19 result where the opaque layer 15 is not deposited, so that predetermined portions of a target can be exposed. The opaque layer 15 prevents an exposing light radiated onto the top surface of the transparent substrate 11 from being passed through the remaining portions except for the portions of the first and second patterns 17,19. The first and second patterns 17,19 transmit the light being radiated onto the top surface of the transparent substrate 11 to allow it to expose the first and second patterns 17,19 during the exposing steps. If a leg width of the gate electrode is to have a thickness of, for example, 0.2 micrometer an i-Ray of 365 nm in wavelength is used. The first pattern 17 is formed in a longitudinal direction having a predetermined thickness of, for example, 0.24–0.28 micrometer, and the second pattern 19 is also formed in the same longitudinal direction having a predetermined thickness of, for example, about 0.22–0.26 micrometer which is about 92–93% of the thickness of the first pattern 17. The first and the second patterns 17,19 are spaced apart as much as the width of the second pattern 19.

The first and the second patterns 17,19 affect the width dimension of the leg portion and the head portion of the T-gate electrode which is controlled by transmitting the light therethrough. Especially, the second pattern 19 enhances the light intensity being transmitted between the first pattern 17 due to the cross interference of the light transmitted through the first and the second patterns 17,19.

The secondary mask 21 functions as a phase shifting mask in which a plurality of stripe shaped optical transmissive parts 23 and phase shifting parts 25 are sequentially and alternately arranged in the same direction as those of the first and the second patterns 17,19. The phase shifting parts 25 of the secondary mask 21 is formed by etching predetermined portions of the top surface of the transparent substrate 11, and the remaining portions thereof being not etched correspond to the optical transmissive parts 23, respectively. At the time, because of the distance between the light source (not shown in the drawings) and the secondary mask 21 being so selected, the light is radiated from the light source in a direction perpendicular to the secondary mask 21. Accordingly, the phase shifting parts 25 shift the phase of the light by the light diffraction and interference phenomenon, and the optical transmissive parts 23 permit the light to be transmitted without shifting the phase of the light. The respective light passing through the optical transmissive parts 23 and the phase shifting parts 25 of the secondary mask 21 have a phase difference therebetween, so that the resolution ability is enhanced by controlling the reinforcement interference in the photoresist. When the phase difference is 180 degree, the resolution ability becomes maximum. In order to obtain a phase difference of 180 degree between the respective light passing through the optical transmissive parts 23 and the phase shifting parts 25 of the secondary mask 21, the difference in thickness (d) between the optical transmissive part 23 and the phase shifting part 25 thereof is expressed by the following equation:

$$d=\lambda/2(n-1) \qquad (1)$$

where n is the refraction rate of the phase shifting parts 25 of the transparent substrate 11, and $\lambda$ is the wavelength of the light radiated from the light source. If the transparent substrate 11 is made of the Silica glass and the i-Ray is used, the refraction rate is approximately 1.4–1.5 and the wavelength ($\lambda$) of the light is 365 nm, and the difference in thickness between the phase shifting part 25 and the optical transmissive part 23 is preferably 365–480. In order to enhance the resolution ability of the photoresist, the width of the optical transmissive part 23 and the phase shifting part 25 should be maintained at 0.48–0.56 nm, which is twice that of the first pattern 17 of the primary mask 13.

Figure 2:
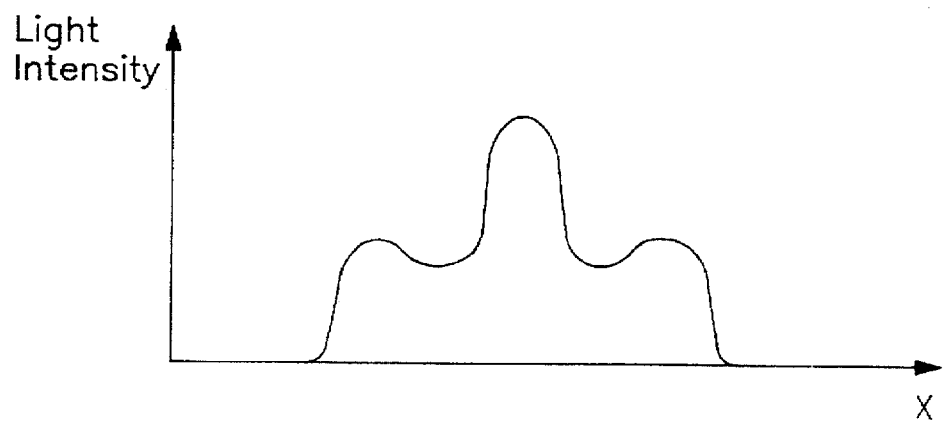
FIG. 2 is a graph showing the distribution of the light intensity of the formation plane, or the photoresist deposited on the wafer when the exposing process is performed, using the photomask as shown in FIG. 1, according to the first embodiment of the present invention.

FIG. 2 represents a graph showing the distribution of the light intensity of the formation plane, or the photoresist deposited on the wafer when the exposing process is performed using the photomask as mentioned by reference to FIG. 1, according to the first embodiment of the present invention.

In the figure, the central peak value indicates the light intensity of the light passing through the first pattern 17 and the remaining value positioned at the both sides of the central peak value represents the light intensity of the light passing through the second pattern 19, respectively. The central peak value passing through the first pattern 17 is the sum of the original light intensity without any interference of the first pattern and second patterns 17, 19 and the light intensity of the cross-reinforced interference of the light at the both sides passing through the second pattern 19, respectively. The side values passing through the second pattern 19 is the sum of the original light intensity without any interference of the first pattern and second patterns 17, 19 and the light intensity of the cross-reinforced interference of the light passing through the first pattern 17, respectively. The light intensity passing through the first pattern 17 is, therefore, greater than that in the second pattern 19

Figure 3:
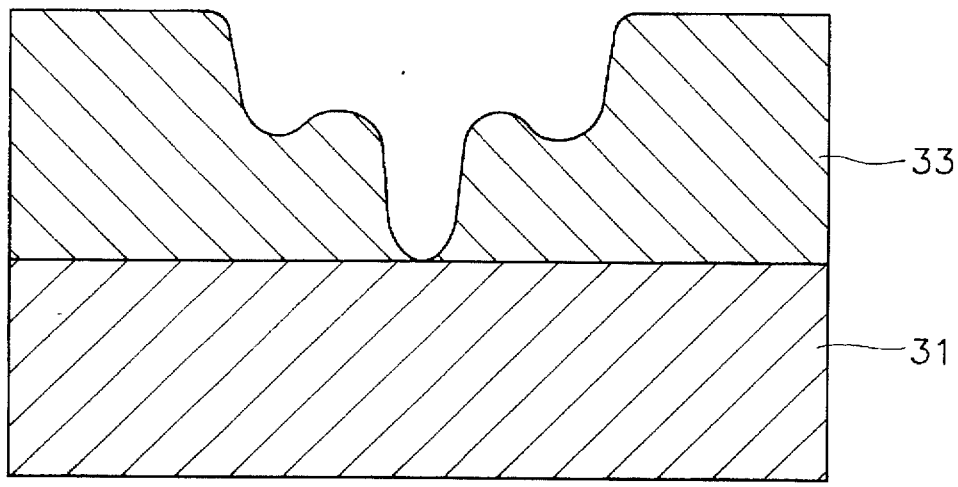
FIG. 3 is a profile of the photoresist which is exposed and developed by the light having the same intensity distribution as shown in FIG. 2, according to the first embodiment of the present invention.

FIG. 3 is a profile of a photoresist 33 which is exposed and developed by the light having the same intensity distribution as shown in FIG. 2.

The positive photoresist 33 deposited on a wafer 31 has a depth for absorbing the light, which is proportionally varied with the intensity of the exposing light. That is to say, if when exposing the intensity of the light transmitted is greater, the depth of the light being absorbed by the positive photoresist 33 becomes greater. On the other hand, if the intensity thereof is less, the depth of the light being absorbed will then be lesser. Therefore, when the photoresist 33 that has been exposed by the light having the same intensity distribution as shown in FIG. 2 and has been developed, the photoresist 33 will have the profile which is opposite to that in the intensity distribution of the light shown in FIG. 2. Accordingly, the photoresist 33 is removed to expose a portion of the surface of the wafer 31 by means of the light transmitted through the first pattern 17 and is further etched away to widely remove the middle portion thereof by means of the light transmitted through the second pattern 19, so that a pattern for forming T-gate electrode having a wider head portion and a narrower leg portion can be obtained.

Figure 4:
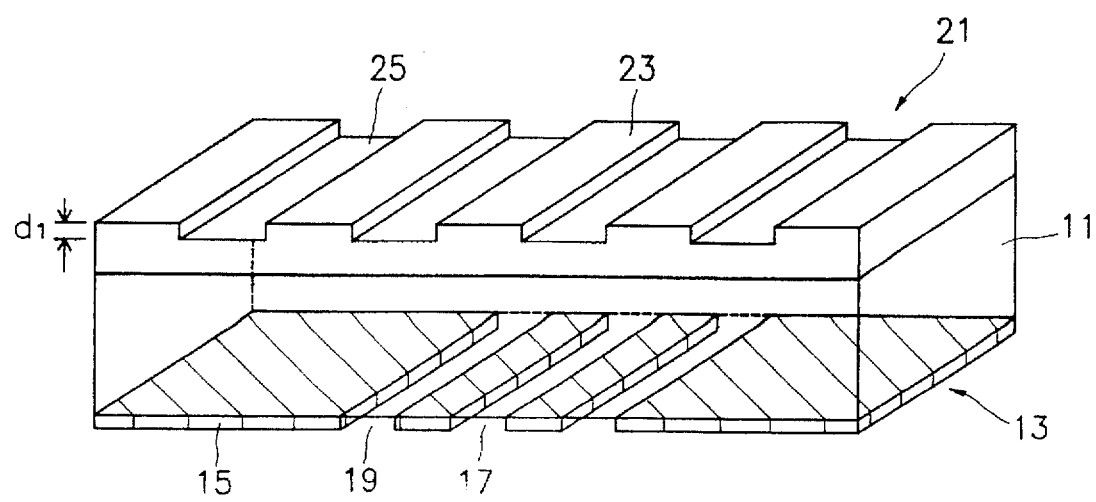
FIG. 4 is a perspective view of a photomask for forming a T-gate electrode of the semiconductor device according to a second embodiment of the present invention.

FIG. 4 represents a perspective view of a photomask for forming a T-gate electrode of the semiconductor device according to the second embodiment of the present invention.

In the Figure, the photomask is composed of a transparent substrate 11 made of Silica glass positioned at the top surface of the primary mask 13 and a secondary mask 21 attached to the top surface thereof. The structure of the photomask according to the second embodiment of the present invention is the same as the photomask according to the first embodiment of the present invention shown in FIG. 1 except that the body of the secondary mask 21 is separated from that of the transparent substrate 11. Thus, the similar reference characters refer to the similar parts, and the detailed description thereof will not be made, for the simplicity of the specification.

Figure 5:
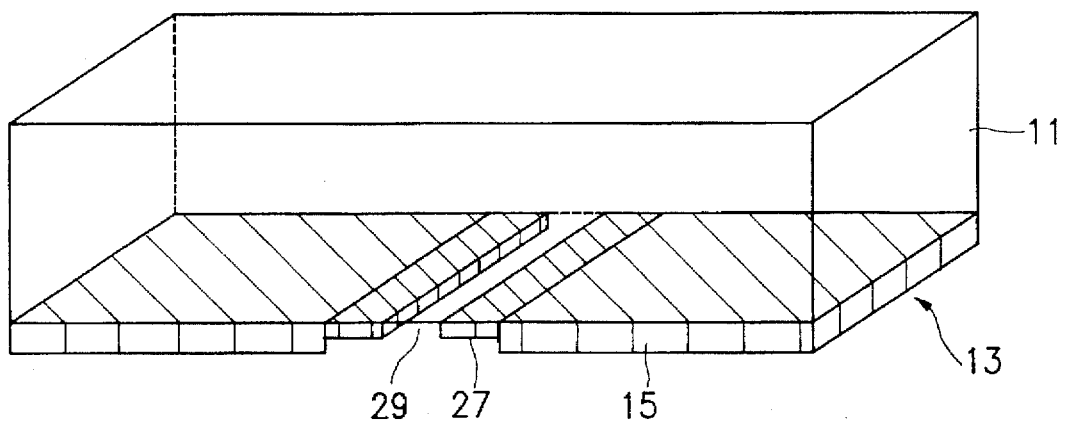
FIG. 5 is a perspective view of a photomask for forming a T-gate electrode of the semiconductor device according to a third embodiment of the present invention.

FIG. 5 is a perspective view of a photomask for forming a T-gate electrode of the semiconductor device according to the third embodiment of the present invention.

In the drawing, the photomask is composed of a transparent substrate 11 made of Silica glass and the primary mask 13 positioned at the top surface of the transparent substrate 11.

The primary mask 13 includes opaque layers 15 spaced at a distance in which a material is deposited in a mask pattern, and can be for example, Cr or $Fe_2O_3$, or other opaque materials layer 15 are deposited, as thick as for example 500–1500 Angstroms, at the bottom surface of the transparent substrate 11, and a semitransparent layer 27 is deposited. The material forming the semitransparent layer 27 is deposited between the opaque layers 15, as thick as for example 100–300 Angstroms, which is very thin relative to the thickness of the opaque layer 15. A semitransparent material can be, for example, a semitransparent resin, and it is deposited in the form of the stripe in a longitudinal direction.

The primary mask 13 also includes a mask pattern 29 between the semitransparent layer 27 in which the opaque layer 15 and the semitransparent layer 27 are not deposited and thus predetermined portions can be exposed. The opaque layer 15 completely blocks the light from being radiated onto the top surface of the transparent substrate 11. The semitransparent layer 27 permits the light to be passed by reducing the intensity of the light transmitted, whereas the mask pattern 29 passes the light without reducing the intensity of the light. Therefore, the semitransparent layer 27 and the mask pattern 29 passes the light so that the variation of the line-width for the leg portion and the head portion can be controlled as desired.

In the above embodiment, it is noted that in order to enhance the resolution of the top surface of the transparent substrate 11, the secondary mask 21 as shown in FIG. 1 may be preferably formed.

Figure 6:
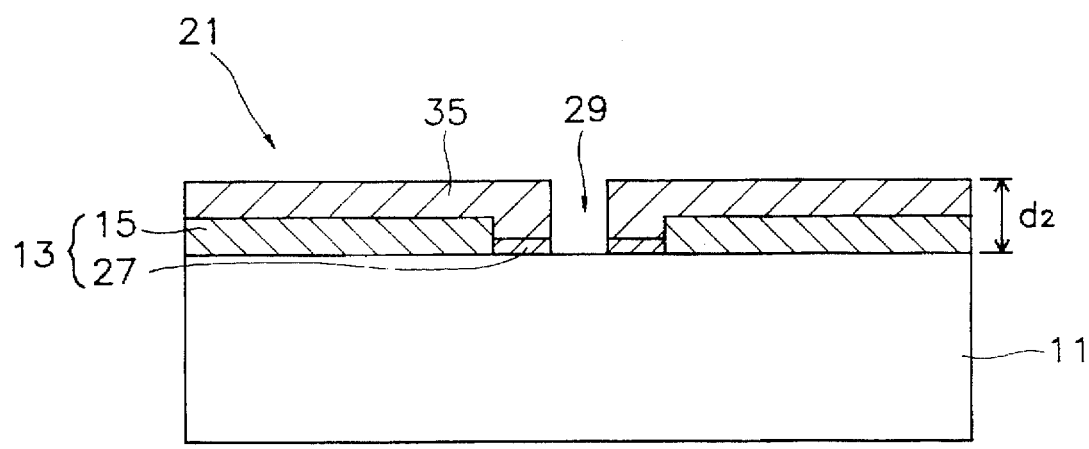
FIG. 6 is a sectional view of a photomask for forming a T-gate electrode of the semiconductor device according to a fourth embodiment of the present invention.

FIG. 6 is a sectional view of a photomask according to a fourth embodiment of the present invention.

In the photomask as shown, the secondary mask 21 is formed on the surface of the opaque layer 15 and the semitransparent layer 27 except for the mask pattern 29 of the primary mask 13. The primary mask 13 is composed of a phase shifting layer 35 made of $SiO_2$ or photoresist and etc., so that the phase of the light transmitted is delayed. In the fourth embodiment, when the phase difference between the mask pattern 29 and the phase shifting layer 35 is 180 degree, the resolution ability thereof becomes maximum. In order to obtain the phase difference of 180 degree between the mask pattern 29 and the phase shifting layer 35, the thickness (d1) of the phase shifting layer 35 is expressed by the equation (2) as follow:

$$d1 = \lambda/2(n1-1) \tag{2}$$

where n1 is the refraction rate of the phase shifting layer 35, and $\lambda$ is the wavelength of the light radiated from the light source. In this embodiment, if the light transmitted is the i-Ray and, because the refraction rate (n1) at $SiO_2$ or photoresist is approximately 1.4–1.5, the thickness (d2) of the phase shifting layer 35 is preferably 365–480.

Other elements in the fourth embodiment are the same as that of the photomask shown in FIG. 5, and therefore the detailed description thereof will be omitted for the simplicity of the specification.

Figure 7:
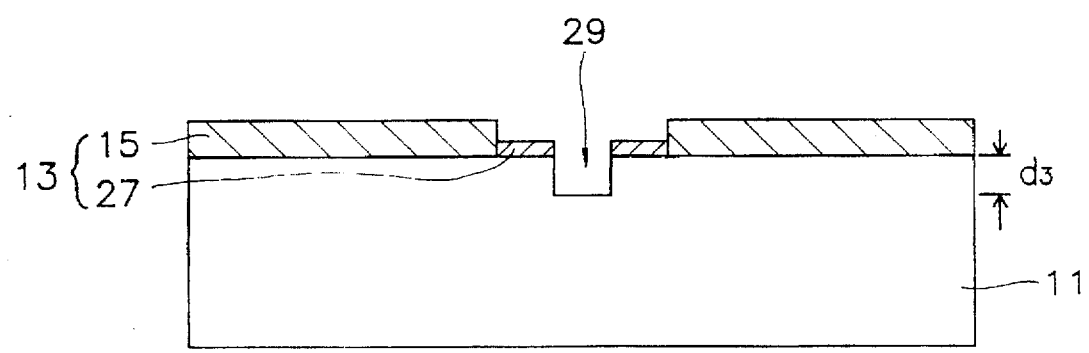
FIG. 7 is a sectional view of a photomask for forming a T-gate electrode of the semiconductor device according to a fifth embodiment of the present invention.

Referring now to FIG. 7, it is a sectional view of a photomask according to a fifth embodiment of the present invention.

In the drawing, the photomask as shown is formed such that the surface level of the portion of the mask pattern 29, located where the opaque layer 15 and the semitransparent layer 27 are not formed, is lower than that of the transparent substrate 11, by a thickness (d3). That is, the mask pattern 29 is formed in a stripe shape and located where the opaque layer 15 and the semitransparent layer 27 on the transparent substrate 11 are not formed. Mask pattern 39 is formed having a depth (d3), as indicated in the drawing. Therefore, the respective light transmitted into the portion at which the mask pattern 29 is formed and the portion at which the opaque layer 15 and the semitransparent layer 27 on the transparent substrate 11 have a difference in phase.

Accordingly, the light transmitted into both the opaque layer 15 and the semitransparent layer 27 on the transparent substrate 11 is further phase-delayed than that into the mask pattern 29. In the embodiment, when the phase difference between the mask pattern 29 and the phase shifting layer 35 is 180 degree, the resolution ability thereof becomes maximum. In order to obtain the phase difference of 180 degree between the mask pattern 29 and the phase shifting layer 35, the depth or thickness (d3) of the phase shifting layer 35 can be obtained using the equation (1) as described hereinbefore. If the transparent substrate 11 is made of Silica transmitted he light being transmitted is the i-Ray, the thickness (d3) is preferably 365-480.

Other elements are the same as that of the photomask shown in FIG. 5, and therefore the detailed description thereof will be omitted for the simplicity of the specification.

As fully discussed with reference to the preferred embodiments, the photomask according to the present invention is composed of a primary mask positioned at the top surface of the transparent substrate made of Silica glass and a secondary mask positioned at the top surface thereof for enhancing the resolution of the primary mask. The primary mask includes an opaque layer in which a material for mask pattern of, for example, Cr or $Fe_2O_3$, or other opaque materials is deposited, as thick as for example 500-1500 Angstroms, at the bottom surface of the transparent substrate, thereby preventing the light radiated from being transmitted, and first and second patterns for forming the leg portion and the head portion of the T-gate electrode by simultaneously radiating the light into the exposed portion of the transparent substrate. The secondary mask includes a phase shifting part for shifting the phase of the light so radiated to effect the diffraction and interference phenomenon of the light transmitted through the predetermined portion of the top surface of the transparent substrate, which is etched to a predetermined extent, and the optical transmissive part for transmitting the light as it is, without shifting the phase of the light.

Therefore, according to the present invention, a simplified photoresist pattern for forming a T-gate electrode of a semiconductor device can be obtained by applying the exposing process and the developing process once onto a single layer of resist, using the photolithography. The superior resolution ability can also be achieved by controlling the diffraction and interference phenomenon of, the light transmitted through the phase shifting part and the transmissive part of the secondary mask.

Although the present invention and its advantages have been described in detail, it should be understood that various changes, substitutions and alterations can be made herein without departing from the spirit and scope of the invention as defined by the appended claims.

What is claimed is:

1. A photomask for forming T-gate electrode of the semiconductor device having a wide head portion and a narrow leg portion comprises:

a transparent substrate having a top surface and a bottom surface; and a primary mask for forming a first pattern for said leg portion and a second pattern for said head portion formed by depositing an opaque layer at a predetermined portion of the bottom surface of said transparent substrate, so as not to permit light radiated onto the top surface to be transmitted, such that said first pattern is formed in stripe shape in a longitudinal direction to expose a portion of the bottom surface of said transparent substrate at which said opaque layer is not deposited, and said second pattern is formed in stripe shape at the both sides of said first pattern in parallel to said first pattern, with said second pattern being spaced apart from said opaque layer at a predetermined distance, whereby a line-width of said first and second pattern is controlled by increasing the intensity of the light being transmitted into said first pattern as compared to that into said second pattern, when exposing to a preselected light.

2. A photomask for forming T-gate electrode of the semiconductor device of claim 1 wherein said transparent substrate is a Silica glass.

3. A photomask for forming T-gate electrode of the semiconductor device of claim 1 wherein said opaque layer is one selected from the group consisting of Cr and $Fe_2O_3$ at a predetermined thickness of 500-1500 Angstrom.

4. A photomask for forming T-gate electrode of the semiconductor device of claim 1 wherein said first pattern has a predetermined thickness of 0.24-0.28 micrometer, and said second pattern has a predetermined thickness of 0.22-0.26 micrometer, respectively.

5. A photomask for forming T-gate electrode of the semiconductor device of claim 4 wherein said first second pattern and said second pattern are spaced apart from each other as much width as said second pattern has.

6. A photomask for forming T-gate electrode of the semiconductor device of claim 5 wherein said secondary mask is formed integrally with said transparent substrate.

7. A photomask for forming T-gate electrode of the semiconductor device of claim 6 wherein said secondary mask is formed separately from said transparent substrate.

8. A photomask for forming T-gate electrode of the semiconductor device of claim 1 further comprises:

a secondary mask formed on the top surface of said transparent substrate for enhancing the resolution ability of said primary mask, said secondary mask further including:

a plurality of phase shifting parts, each having a predetermined thickness, formed by etching predetermined portions of the top surface of said transparent substrate to a predetermined depth, for shifting the phase of light to be transmitted, whereby the remaining portions of said transparent substrate being not etched define a plurality of optical transmissive parts, each having a predetermined thickness, for permitting the light to be transmitted without shifting the phase of light, with said plurality of optical transmissive parts and phase shifting parts being sequentially and alternately arranged in stripe shape in parallel direction with those of said first and second patterns, such that the light passing therethrough of said secondary mask has a phase difference therebetween, thereby enhancing the resolution ability of said primary mask.

9. A photomask for forming T-gate electrode of the semiconductor device of claim 8 wherein the difference in thickness (d) between said optical transmissive part and said phase shifting part is expressed by the equation as follow:

$$d = \lambda/2(n-1) \tag{1}$$

(wherein n is the refraction rate of said phase shifting part, and $\lambda$ is the wavelength of the light, respectively).

10. A photomask for forming T-gate electrode of the semiconductor device of claim 9 wherein said light transmissive part and said phase shifting part have a width which is twice that of said first pattern of said primary mask.

11. A photomask for forming T-gate electrode of the semiconductor device having a head portion and a leg portion comprises:

a transparent substrate having a top surface and a bottom surface;

a primary mask for forming a first pattern for said leg portion and a second pattern for said head portion formed by depositing an opaque layer at a predetermined portion of the bottom surface of said transparent substrate, so as not to permit light radiated onto the top surface to be transmitted, such that said first pattern is formed in stripe shape in a longitudinal direction to expose a portion of the bottom surface of said transparent substrate at which said opaque layer is not deposited, and said second pattern is formed in stripe shape at the both sides of said first pattern in parallel direction with that of said first pattern, with said second pattern being spaced apart from said opaque layer at a predetermined distance, whereby a line-width of said first and second pattern is controlled by increasing the intensity of the light being transmitted into said first pattern as compared to that into said second pattern, when exposing to a preselected light, and a secondary mask formed on the top surface of said transparent substrate for enhancing the resolution ability of said primary mask, said secondary mask further including: a plurality of phase shifting parts formed by etching predetermined portions of the top surface of said transparent substrate to a predetermined depth for shifting the phase of light to be transmitted, whereby the remaining portions of said transparent substrate being not etched define a plurality of optical transmissive parts for permitting the light to be transmitted without shifting the phase of light, with said plurality of optical transmissive parts and phase shifting parts being sequentially and alternately arranged in stripe shape in parallel direction with those of said first and second patterns, such that the light passing therethrough of said secondary mask has a phase difference therebetween, thereby enhancing the resolution ability of said primary mask.

12. A photomask for forming T-gate electrode of the semiconductor device of claim 11 wherein said secondary mask is formed integrally with said transparent substrate.

13. A photomask for forming T-gate electrode of the semiconductor device of claim 11 wherein said secondary mask is formed separately from said transparent substrate.

14. A photomask for forming T-gate electrode of the semiconductor device having a head portion and a leg portion comprises:

a transparent substrate having a top surface and a bottom surface; and a primary mask for forming a mask pattern formed in stripe shape for passing the light without reducing the intensity of the light, said mask pattern being formed by depositing an opaque layer at predetermined portions of the bottom surface of said transparent substrate, so as not to permit light radiated onto the top surface to be transmitted, and a semitransparent layer formed between said predetermined portions, at which said opaque layer is deposited, for permitting the light to be passed by reducing the intensity of the light transmitted, such that said mask pattern is defined in a longitudinal direction at a portion at which said opaque layer and said semitransparent layer are not deposited to expose a portion of the bottom surface of said transparent substrate, whereby a line-width of said first and second pattern is controlled by increasing the intensity of the light being transmitted into said first pattern as compared to that into said second pattern, when exposing to a preselected light.

15. A photomask for forming T-gate electrode of the semiconductor device of claim 14 further include said a secondary mask formed on the top surface of said transparent substrate for enhancing the resolution ability of said primary mask, said secondary mask further comprises:

a plurality of phase shifting parts formed by etching predetermined portions of the top surface of said transparent substrate to a predetermined depth for shifting the phase of light to be transmitted, whereby the remaining portions of said transparent substrate being not etched define a plurality of optical transmissive parts for permitting the light to be transmitted without shifting the phase of light, with said plurality of optical transmissive parts and phase shifting parts being sequentially and alternately arranged in stripe shape in parallel direction with that of said mask pattern of said primary pattern, such that the light passing therethrough of said secondary mask has a phase difference therebetween, thereby enhancing the resolution ability of said primary mask.

16. A photomask for forming T-gate electrode of the semiconductor device of claim 15 wherein said secondary mask is formed integrally with said transparent substrate.

17. A photomask for forming T-gate electrode of the semiconductor device of claim 15 wherein said secondary mask is formed separately from said transparent substrate.

18. A photomask for forming T-gate electrode of the semiconductor device of claim 14 wherein said opaque layer is one selected from the group consisting of Cr and $Fe_2O_3$ at a predetermined thickness of 500–1500 Angstrom.

19. A photomask for forming T-gate electrode of the semiconductor device of claim 14 wherein said semitransparent layer is one selected from the group consisting of Cr and $Fe_2O_3$ at a predetermined thickness of 100–300 Angstrom.

20. A photomask for forming T-gate electrode of the semiconductor device of claim 14 further comprises: a phase shifting layer having a predetermined thickness formed on the surface of said opaque layer and said semitransparent layer except for said mask pattern of said primary mask for shifting the phase of light to be transmitted.

21. A photomask for forming T-gate electrode of the semiconductor device of claim 20 wherein said phase shifting layer is made of $SiO_2$ or photoresist.

22. A photomask for forming T-gate electrode of the semiconductor device of claim 21 wherein the thickness (d2) of said phase shifting layer is expressed by the equation (2) as follow:

$$d2 = \lambda/2(n1-1) \tag{2}$$

(where n is the refraction rate of said phase shifting layer, and $\lambda$ is the wavelength of the light, respectively).

23. A photomask for forming T-gate electrode of the semiconductor device of claim 14 wherein the level of said mask pattern is lower than that of said transparent substrate.

* * * * *